United States Patent
Rao et al.

(10) Patent No.: US 6,438,065 B1
(45) Date of Patent: Aug. 20, 2002

(54) REDUNDANCY ARCHITECTURE AND METHOD FOR NON-VOLATILE STORAGE

(75) Inventors: Kameswara K. Rao, San Jose; Martin L. Voogel, Santa Clara; Michael J. Hart, Palo Alto, all of CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 09/552,280

(22) Filed: Apr. 19, 2000

Related U.S. Application Data

(63) Continuation-in-part of application No. 09/262,981, filed on Mar. 5, 1999, now Pat. No. 6,055,205.

(51) Int. Cl.$^7$ ................................................ G11C 8/00

(52) U.S. Cl. ............................ 365/230.06; 365/189.01; 365/200

(58) Field of Search ............................ 365/200, 189.01, 365/189.04, 230.06

(56) References Cited

U.S. PATENT DOCUMENTS

| | | | |
|---|---|---|---|
| 4,689,504 A | 8/1987 | Raghunathan et al. | 307/449 |
| 5,563,842 A | 10/1996 | Challa | 365/230.06 |
| 5,604,693 A | 2/1997 | Merrit et al. | 365/96 |
| 5,680,360 A | 10/1997 | Pilling et al. | 365/225.7 |
| 5,790,448 A | 8/1998 | Merritt et al. | 365/96 |
| 5,796,656 A | 8/1998 | Kowshik et al. | 365/185.23 |
| 5,812,459 A | 9/1998 | Atsumi et al. | 365/185.23 |
| 5,831,923 A | 11/1998 | Casper | 365/225.7 |
| 5,844,422 A | * 12/1998 | Trimberger et al. | 326/38 |
| 5,898,630 A | * 4/1999 | Madurawe | 365/203 |
| 5,986,916 A | 11/1999 | Merritt et al. | 365/96 |
| 6,222,757 B1 | * 4/2001 | Rau et al. | 365/154 |
| 6,320,412 B1 | * 11/2001 | Ting et al. | 326/41 |

OTHER PUBLICATIONS

Ying Shi et al.; "Polarity Dependent Gate Tunneling Currents in Dual–Gate CMOSFET's", IEEE Transactions on Electron Devices, vol. 45, No. 11, Nov. 1998, pp. 2355–2360.

Philippe Candelier et al., "One Time Programmable Drift Antifuse Cell Reliability", IEEE 38th Annual International Reliability Physics Symposium, San Jose, CA, 2000, pp. 169–173.

Joo–Sun Choi et al., "Antifuse EPROM Circuit for Field Programmable DRAM", IEEE International Solid–State Circuits Conference, 2000, Session 24, Paper WP 24.8, pp. 406–407 and 330–331.

* cited by examiner

*Primary Examiner*—Hoai V. Ho
*Assistant Examiner*—Thong Le
(74) *Attorney, Agent, or Firm*—Edel M. Young; Scott R. Brown

(57) ABSTRACT

A field programmable gate array (FPGA) includes a first non-volatile memory cell and a second non-volatile memory cell. Each of the two non-volatile memory cells is capable of storing at least one bit of information. The second non-volatile memory cell provides redundant storage of the information stored in the first non-volatile memory cell. A read circuit is coupled to the first non-volatile memory cell and the second non-volatile memory cell. The read circuit simultaneously reads the information stored in the first and second non-volatile memory cells, The read circuit reads the information stored in the first non-volatile memory cell even if the second non-volatile memory cell is defective or is not programmed properly. The FPGA may include a third non-volatile memory cell coupled to the read circuit, which provides redundant storage of the information stored in the first non-volatile memory cell. Each non-volatile memory cell includes a storage transistor having a source and a drain, both of which are coupled to ground. Additionally, each storage transistor has a gate oxide. Each non-volatile memory cell is programmed by breaking the gate oxide of the storage transistor.

31 Claims, 6 Drawing Sheets

REDUNDANCY ARCHITECTURE AND METHOD FOR NON-VOLATILE STORAGE

This application is a continuation-in-part of application Ser. No. 09/262,981 entitled "Decoder for Non-Volatile Memory Array Using Gate Breakdown Structure in Standard Sub 0.35 Micron CMOS Process" filed Mar. 5, 1999, now U.S. Pat. No. 6,055,205 the disclosure of which is incorporated by reference herein.

CROSS REFERENCE TO RELATED APPLICATIONS

This application relates to
1. U.S. patent application Ser. No. 09/553,571 entitled: "Non-Volatile Memory Array Using Gate Breakdown Structures" commonly owned and filled concurrently with the present application.
2. U.S. patent application Ser. No. 09/552,625 now U.S. Pat. No.: 6,243,294 B1 entitled: "Improved Array Arrangement for Non-Volatile Memory Using Gate Breakdown Structure in Stantard Sub 0.25 Micron CMOS Process" commonly owned and filed concurrently with the present application.

1. Technical Field

This invention relates to integrated circuits, particularly programmable logic devices of field programmable gate arrays (FPGAs). More particularly, this invention relates to a redundancy system for storing a decryption key that reduces the possibility that the decryption key is read improperly.

2. Background of the Invention

Field programmable gate arrays (FPGAs) are configured to perform particular functions by loading a stream of bits, or bitstream, into the FPGA. Each time an FPGA is powered-up or reset, the bitstream containing the FPGA functions is re-loaded into the FPGA.

Since the bitstream describes the functions performed by the FPGA, an individual may monitor or otherwise capture of copy of the bitstream in an effort to copy the functionality of the FPGA. To discourage this type of copying activity, the bitstream is encoded prior to transmitting the bitstream to the FPGA. For example, the bitstream can be encoded by an encoder using an encryption key. To properly utilize the encoded bitstream, the FPGA must first decode the bitstream. For example, a decoder in the FPGA uses a decryption key to decode the bitstream. Once decoded, the bitstream is used by the remianing portions of the FPGA to define the functions performed by the FPGA.

To adequately protect the content of the bitstream, the user should be able to program the encryption key and the decryption key after the FPGA is manufactured. Thus, different FPGAs may use different pairs of keys (i.e., encryption key and decryption key) to encode the bitstream. Typical FPGAs include a non-volatile memory for storing decryption keys, adjusting (or "trimming") internal parameters, and other data that should be maintained when the FPGA is powered-down or reset. This non-volatile memory is programmed to store the decryption key. Each time the FPGA is powered-up or reset, the encoded bitstream is received and decoded by a decoder using the decryption key stored in non-volatile memory.

However, if one or more bits of the decryption key are corrupted or cannot be read accurately from the non-volatile memory, then the encoded bitstream cannot be properly decoded. The FPGA will not operate properly unless the bitstream is decoded accurately. Therefore, it is desirable to provide a system to avoid improperly reading the decryption key from the non-volatile memory.

SUMMARY OF THE INVENTION

The present invention provides a redundant non-volatile memory array that stores data (such as a decryption key) in a manner that reduces the possibility of misreading the stored data from the redundant non-volatile memory array. One aspect of the invention provides a first non-volatile memory cell and a second non-volatile memory cell, each of which is capable of storing at least one bit of information. The second non-volatile memory cell provides redundant storage of the information stored in the first non-volatile memory cell. A read circuit coupled to the first and second non-volatile memory cells reads the information stored in the first and second non-volatile memory cells.

According to another implementation, the read circuit simultaneously reads the information stored in the first and second non-volatile memory cells. Additionally, the read circuit is able to read information stored in the first non-volatile memory if the second non-volatile memory is defective or is not programmed properly.

In a described embodiment of the invention, each non-volatile memory cell includes a storage transistor having a source and a drain, both of which are coupled to ground.

Another aspect of the invention provides an access transistor coupled to a storage transistor. In this embodiment, the storage transistor is programmed through the access transistor. Additionally, each storage transistor has a gate oxide. Each non-volatile memory cell is programmed by breaking the gate oxide of the storage transistor.

Another aspect of this invention provides a first decoder coupled to the first non-volatile memory cell and a second decoder coupled to the second non-volatile memory cell. The first and second decoders select the first or second non-volatile memory cell for programming.

DETAILED DESCRIPTION OF THE DRAWINGS

This invention relates to a redundant memory storage array that reduces the likelihood of improperly reading data (such as a decryption kay) from a memory array. Each bit of data is stored at four different locations in the memory array. When reading the data, only one of the four copies of the bit needs to have been properly programmed. Thus, if some of the bits are not programmed properly, or a portion of the memory array is defective, the data can be read as long as at least one of the four bits was properly programmed.

Figure 1:
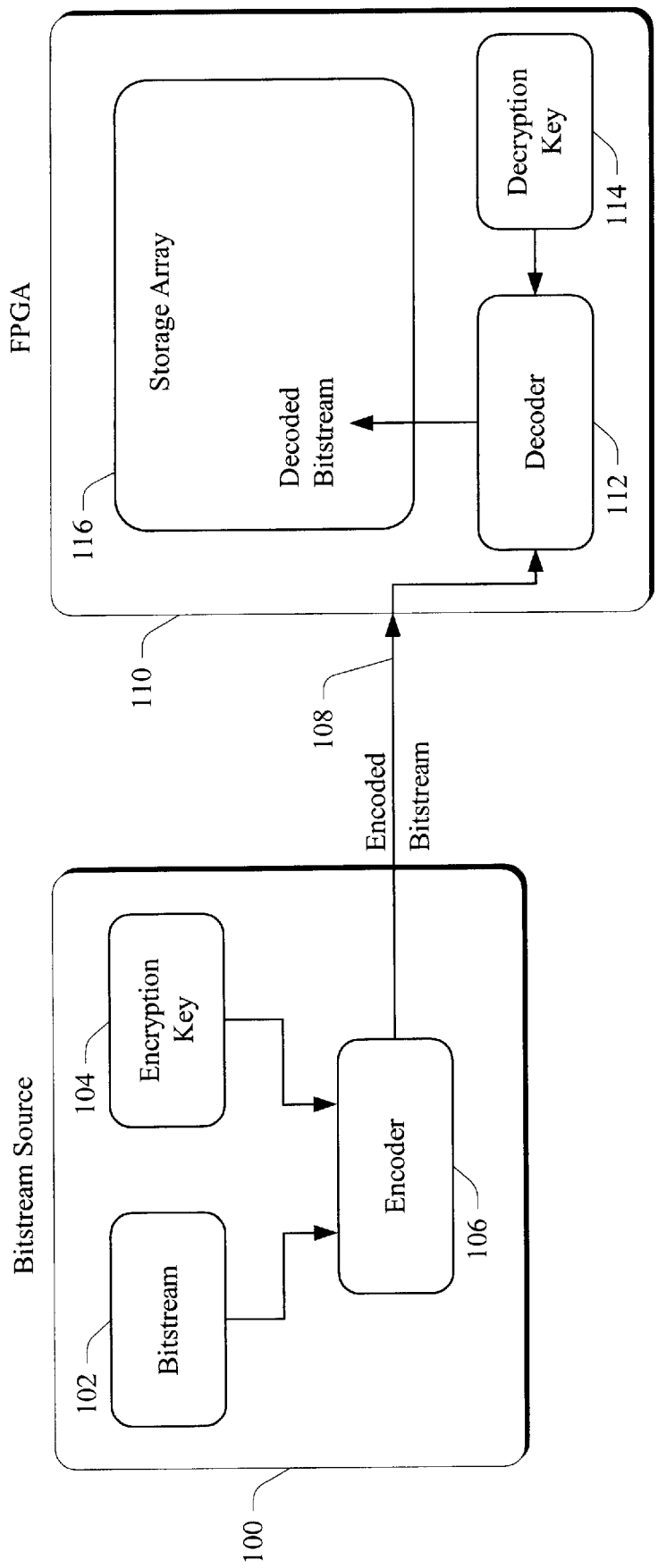
FIG. 1 is a block diagram illustrating the pertinent components for encoding and decoding a bitstream.

FIG. 1 is a block diagram illustrating the pertinent components for encoding and decoding a bitstream. A bitstream source 100 includes a bitstream 102, an encryption key 104, and an encoder 106. The encryption key 104 can be stored, for example, in a memory such as a read-only memory (ROM). The encoder 106 may be implemented in hardware and/or software. The bitstream is loaded into a field programmable gate array (FPGA) 110 each time the FPGA 110 is powered-up or reset. The bitstream 102 defines the various functions to be performed by the FPGA 110. To prevent unwanted copying of the bitstream 102 as it is transferred from the bitstream source 100 to the FPGA 110, the bitstream is encoded by encoder 106 using the encryption key 104. In an example used throughout this description of the invention, the encryption key 104 is a 64-bit encryption key. Various types of encryption schemes, such as the RSA (Rivest, Shamir and Adleman) public-key encryption algorithm, can be used to encode the bitstream.

Encoder 106 applies encryption key 104 to bitstream 102 to generate an encoded bitstream 108, which is transferred to FPGA 110 when FPGA 110 is powered-up or reset. FPGA 110 includes a decoder 112, a decryption key 114, and a programmable storage array 116. The decoder 112 receives the encoded bitstream 108 and decodes the bitstream using decryption key 114. After decoder 112 has decoded bitstream 108, the decoded bitstream is provided to the storage array 116, which interprets the functions defined in the bitstream. To properly decode bitstream 108, the decryption key 114 must match the encryption key 104 used to encode the bitstream. If a single bit of the decryption key 114 differs from the encryption key 104, then the bitstream 108 will not be accurately decoded. The redundancy architecture discussed below increases the likelihood that he decryption key 114 will be read accurately from FPGA 110 when decoding the encoded bitstream 108.

In the example of FIG. 1, the bitstream is encoded by encoder 106 each time the FPGA 110 is powered-up or reset. In an alternate embodiment, the bitstream 102 is encoded by encoder 106 using encryption key 104, and the encoded bitstream is stored, for example,in bitstream source 100. This embodiment allows the encoded bitstream to be quickly downloaded to the FPGA 110 because the bitstream is already encoded.

Figure 2:
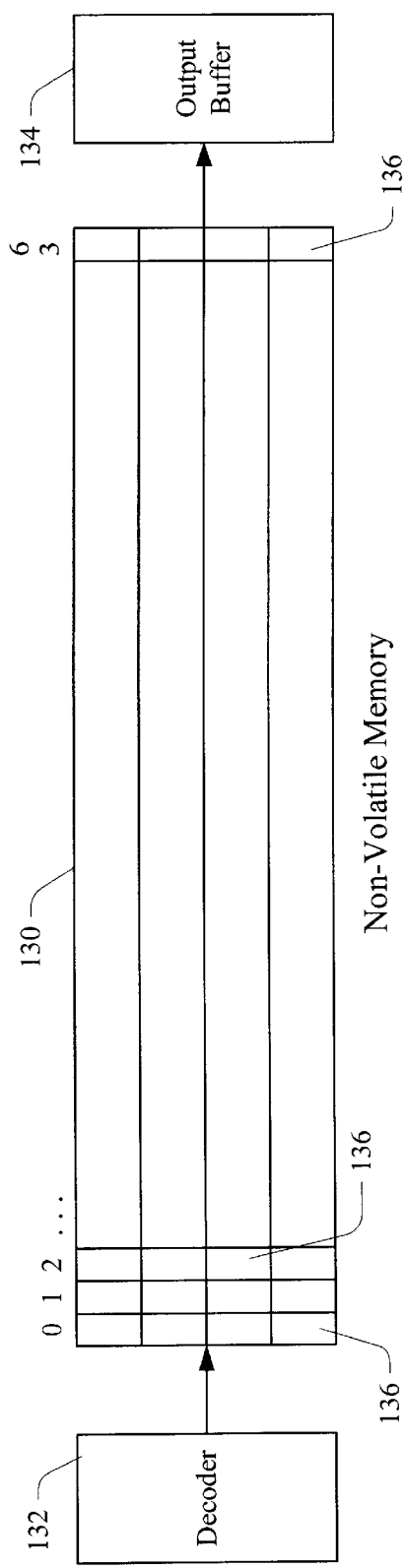
FIG. 2 illustrates a block diagram of a non-volatile memory, a decoder, and an output buffer in a field programmable gate array.

FIG. 2 illustrates a block diagram of a non-volatile memory 130, a decoder 132, and an output buffer 134 in a field programmable gate array. Non-volatile memory 130 is arranged in an array of four rows and 64 columns, resulting in 256 storage elements (or storage bits) 136. Non-volatile memory 130 stores four separate copies of the decryption key 114 (FIG. 1). Thus, each bit of the decryption key 114 has three redundant copies, any one of which can be used to determine the appropriate value for the particular bit of the encryption key.

The decoder 132 selects one of the 64 columns of storage elements in the non-volatile memory 130. The value of the data represented by the bits in the selected column is output through the output buffer 134. The output buffer 134 provides the output data to the decoder 112 (FIG. 1) that decodes the encoded bitstream.

Figure 3:
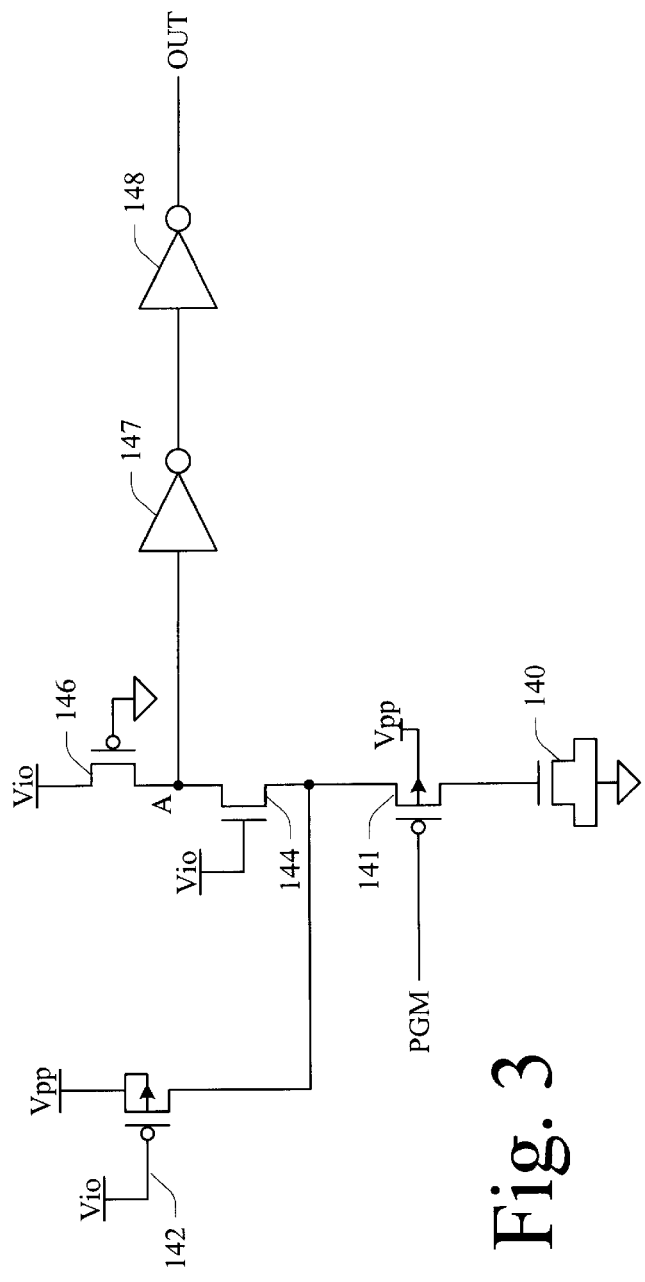
FIG. 3 illustrates a basic circuit for a single non-volatile bit of memory.

FIG. 3 illustrates a basic circuit for the single non-volatile bit of memory 136. A gate breakdown transistor 140 has its source and drain connected to ground. The gate breakdown transistor 140 is a one-time programmable device. The gate of transistor 140 is coupled to the source of an access transistor 141. The drain of access transistor 141 is coupled to the source of a p-channel device 142 and coupled to a N-channel device 144. The N-channel device 144 is coupled to another device 146 and a pair of inverters 147 and 148, which form an output buffer. The operation of the circuit shown in FIG. 3 is discussed below with reference to FIG. 4.

Figure 4:
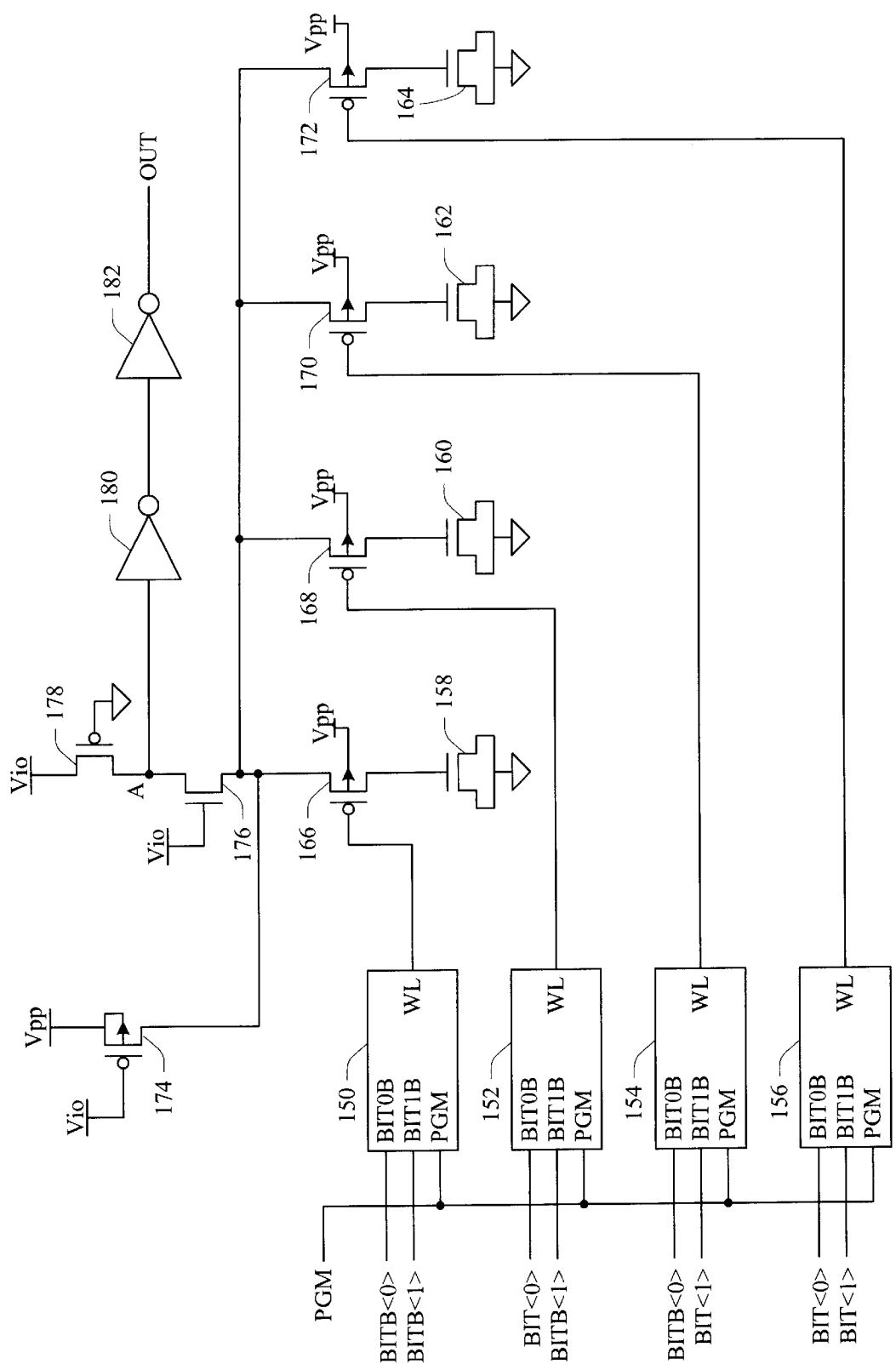
FIG. 4 is a schematic diagram illustrating decoders, output buffers, and four bits of non-volatile memory.

FIG. 4 is a schematic diagram illustrating decoders, output buffers, and four bits of non-volatile memory. The four bits of non-volatile memory correspond to a column of storage elements 136 shown in FIG. 2. The non-volatile memory uses a standard CMOS process using a gate breakdown device as the storage device. In 0.35 micron and sub-0.35 micron CMOS processes, the gate oxide thickness of the transistor is 70 Å (angstroms) or less. In these processes, the resulting gate breakdown voltage of the transistor is less than the source-to-substrate and the drain-to-substrate breakdown voltage. As discussed in greater detail below, the gate breakdown device is "programmed" by breaking (or rupturing) the gate oxide of the transistor. Thus, the gate breakdwon devices used to create the non-volatile memory array are one-time programmable. Once the gate oxide of the transistor has been broken, the gate oxide cannot be "unbroken." The gate breakdown devic may also be referrd to as a gate breakdown transistor or a storage transistor.

FIG. 4 illustrates four gate breakdown devices (e.g., transistors) 158, 160, 162, and 164 connected in parallel with one another. Each gate breakdown device has its source and drain connected to ground. The gate of each of the four gate breakdown devices 158, 160, 162, and 164 is coupled to an associated access transistor 166, 168, 170, and 172, respectively. Each access transistor 166–172 is a p-channel thick oxide device. The thickness of each access transistor is approximately 70 Å, which is greater than the thickness of a typical transistor of 40 Å. This added thickness prevents the access transistor from breaking when the associated gate breakdown device is programmed.

Figure 5:
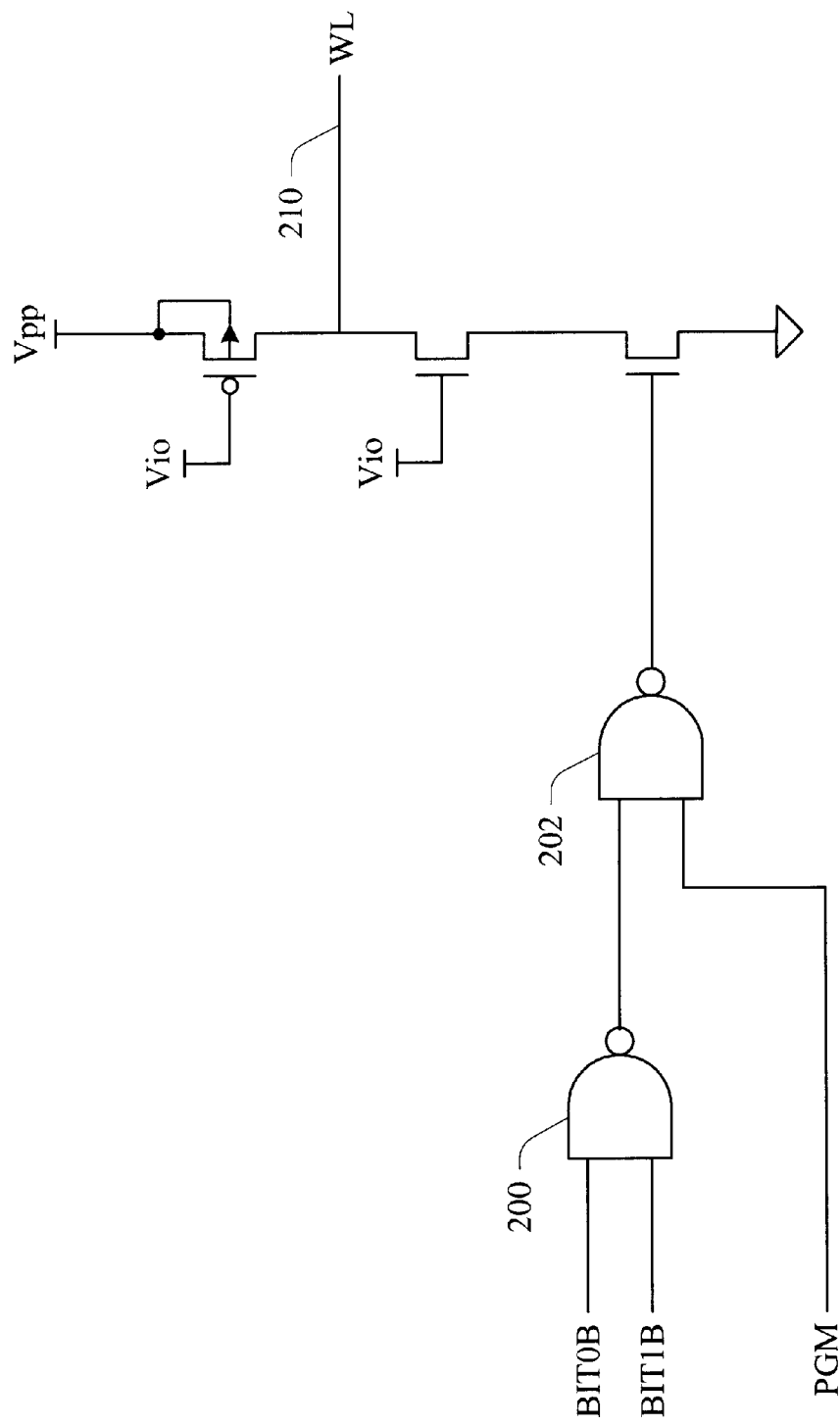
FIG. 5 is a schematic diagram of one of the decoders shown in FIG. 4.

Four decoders 150, 152, 154, and 156 are used to select one of the four gate breakdown devices 158–164 for programming, based on the value of BIT0 and BIT1. Each decoder 150–156 is coupled to the gate of one of the access transistors 166–172. The circuit diagram for the decoders 150–156 is illustrated in FIG. 5, which is discussed below.

Which programming a particular gate breakdown device, the corresponding decoder provides a program signal (PGM) to the gate of the corresponding access transistor. For example, to program gate breakdown device 160, the decoder 152 is selected (based on the value of BIT0 and BIT1), which causes the decoder to apply the PGM signal to the gate of access transistor 168.

The drain of each access transistor 166–172 is coupled to the source of a thick oxide p-channel device 174. The gate of device 174 is coupled to Vio (typically 3.3V) and the drain of device 174 is coupled to Vpp. The drain of each access transistor 166–172 is also coupled to a "read circuit" through an N-channel device 176 having its gate coupled to Vio. Device 176 is coupled to another device 178 having its gate coupled to ground and also coupled to a pair of inverters 180 and 182 that form an output buffer. The "read circuit" mentioned above includes device 176, device 178, and the output buffer formed by inverters 180 and 182.

During a programming operations, one of the four gate breakdown devices 158–164 is selected to be programmed. Vpp is set to 8V, which turns on device 174. This applies the 8V supplied by the Vpp to the gate of the selected gate breakdown device, breaking the gate oxide of the device. Vpp is then returned to 3.3V until another programming operation is initiated. During the programming operation, the decoder applies approximately 4V to the selected access transistor. Thus, current flows through the selected access transistor and correponding gate breakdown device, but no current flows through the other three device pairs (access transistor and corresponding gate breakdown device). All of the devices in the high voltage path are connected such that the voltages between gate and source, gate and drain, and source and drain are not close to their assoctiated breakdown voltages.

During a read operation, Vpp is set to 3.3V, which turns off device 174. Also, decoders 150–156 provide a logic "0" to each of the access transistors 166–172, thereby allowing each gate breakdown device 158–164 to be read. During the read operation, if there is no current flow through the gate breakdown device, then the gate oxide of the device has not been broken. In this situation, the value at point A (located between devices 176 and 178) is high. Similarly, the output signal (OUT) is high. However, if the gate oxide of the gate breakdown device has been broken, then the gate breakdown device functions similar to a resistor having a value less than 10,000 ohms. In this situation, current flows through the gate breakdown device, which pulls the voltage at point A to a low value and causes the output signal (OUT) to be low. Thus, when the gate oxide of the gate breakdown device has been broken, the circuit reads a logic "0" and when the gate oxide has not been broken, the circuit reads logic "1".

As shown in FIG. 4, four storage elements (i.e., gate breakdown devices 158–164) are coupled in parallel with one another to improve programming yield by providing redundancy. All four storage elements are read simultaneously to determine a single output value. If one or more of the four storage elements is programmed (i.e., the gate oxide of the gate breakdown device has been broken), then the output is 0. Otherwise, if none of the four storage elements have been programmed, then the output is 1.

Although the four storage elements shown in FIG. 4 are adjacent to one another, in a typical manufacturing process the four storage elements are distributed within the non-volatile memory array. Thus, a defect in one area of the memory array does not necessarily affect the programming of the other three related storage elements.

FIG. 5 is a schematic diagram of one of the decoders shown in FIG. 4. A NAND gate 200 receives the two selection bits and generates an output that is provided to an input of another NAND gate 202. NAND gate 202 also receives the program signal as an input. The output of the NAND gate 202 is provided on word line 210.

Figure 6:
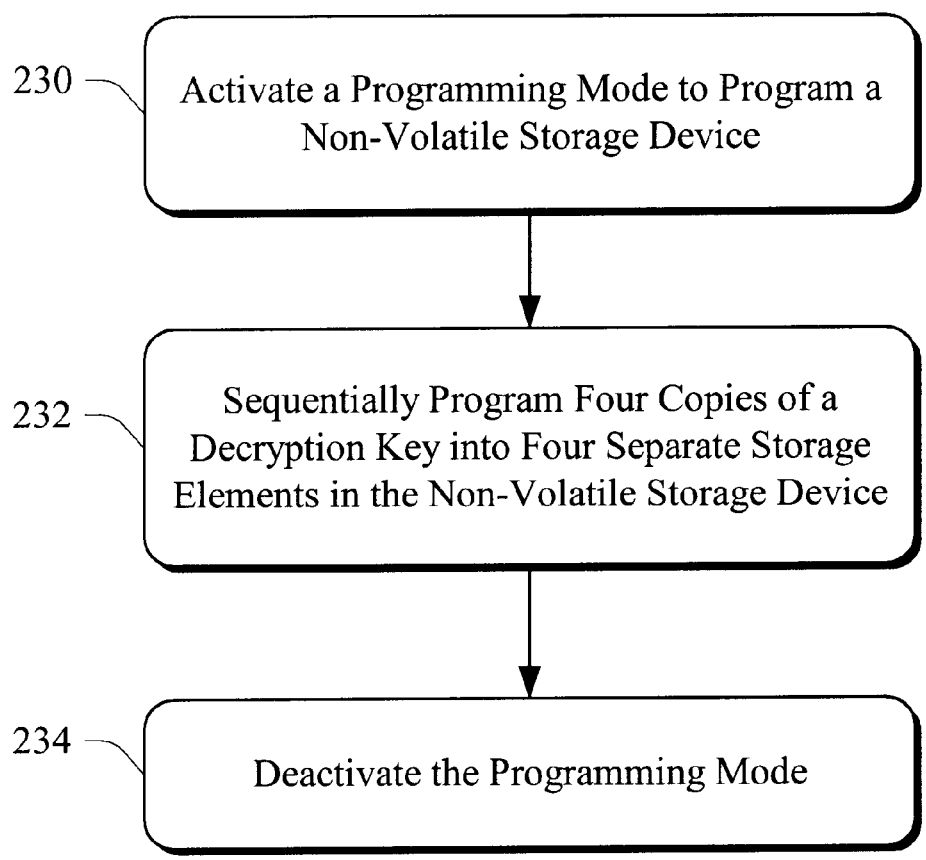
FIG. 6 is a flow diagram illustrating a procedure for storing data in a non-volatile storage device.

FIG. 6 is a flow diagrm illustrating a procedure for storing data in a non-volatile storage device. Initially, the procedure activates a programming mode to program data in the non-volatile storage device (step 230). In the example discussed above, the programming mode is activated by raising the value of Vpp from 3.3V to 8V, which causes the gate oxide to break on the selected gate breakdown device. For copies of all 64 bits of a decryption key are programmed into the storage elements of the non-volatile storage device (step 232). All of the bits are programmed one bit at a time. After all four copies of the decryption key are programmed, the programming mode is deactivated (step 234).

Figure 7:
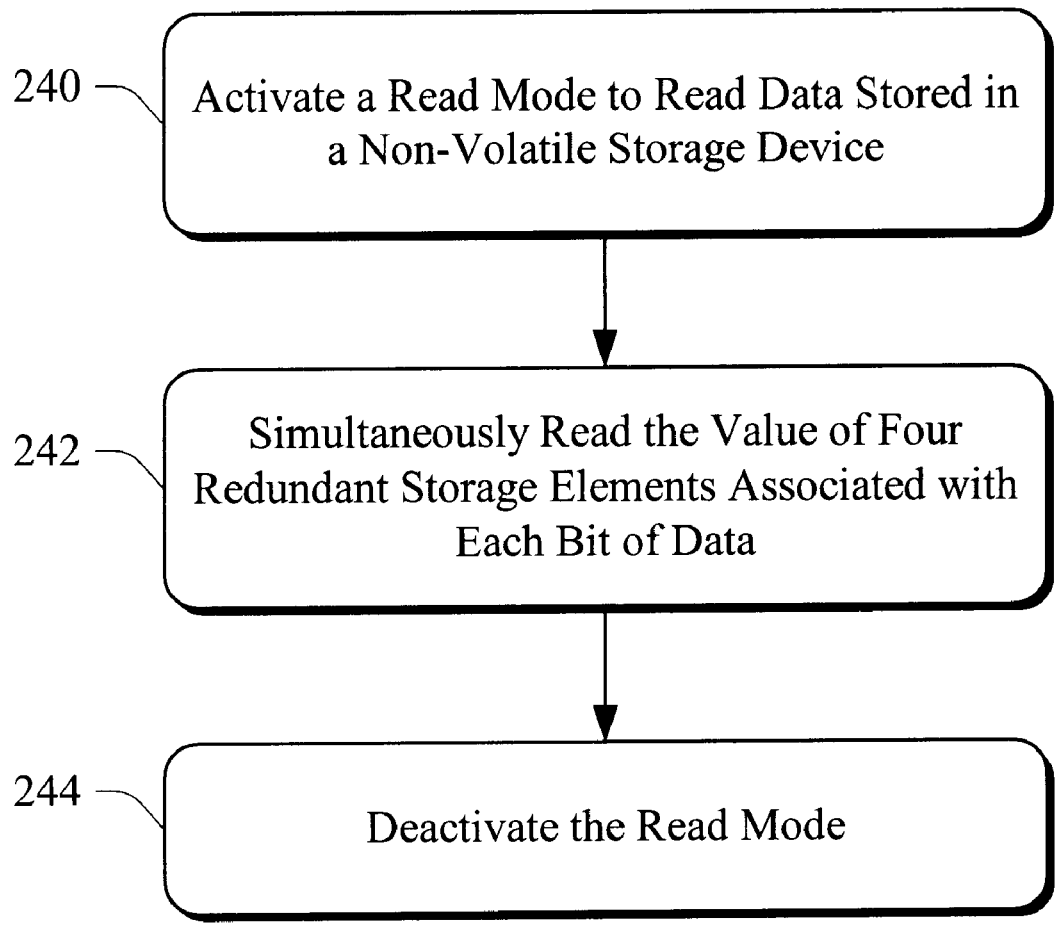
FIG. 7 is a flow diagram illustrating a procedure for reading data from a non-volatile storage device.

FIG. 7 is a flow diagram illustrating a procedure for reading data from a non-volatile storage device. A read mode is activated to read data from a non-volatile storage device (step 240). The system simultaneously reads all four redundant storage elements associated with each bit of data (step 242). If any one or more of the storage elements was previously programmed, then the output is 0. Thus, as long as at least one of the four redundant storage elements is properly programmed, the bit value read from the non-volatile storage device will be correct. After all the storage elements have been read, the read mode is deactivated (step 244). In the example in which the data read from the non-volatile memory is a decryption key, the decoder can begin decoding the encoded bit stream as soon as the decryption key has been read from the non-volatile memory.

The invention is described herein with reference to an architecture that stores redundant copies of an encryption key in non-volatile memory for use in decoding an encoded bitstream. However, the teachings of the present invention can be applied to storing redundant copies of any type of data in any type of storage device contained in an FPGA or other integrated circuit. The describe architecture reduces the likelihood of improperly reading any type data from a storage device.

Although the invention has been described in language specific to structural features and/or methodological steps, it is to be understood that the invention defined in the appended claims is not necessarily limited to the specific features or steps described. Rather, the specific features and steps are disclosed as prefered forms of implementing the claimed invention.

What is claimed is:

1. A field programmable gate array (FPGA), comprising:
   a first non-volatile memory cell t store at least one bit of information;
   a second non-volatile memory cell to redundantly store one bit of information that is identical to the one bit of information stored in the first non-volatile memory cell; and
   a read circuit coupled to the first non-volatile memory cell and the second non-volatile memory cell to read the information stored in the first and second non-volatile memory cells.

2. The field programmable gate array of claim 1, wherein the read circuit simultaneously reads the information stored in the first and second non-volatile memory cells.

3. The field programmable gate array of claim 1, wherein the read circuit reads the information stored in the first non-volatile memory cell if the second non-volatile memory cell is defective.

4. The field programmable gate array of claim 1, wherein the read circuit reads the information stored in the second non-volatile memory cell if the first non-volatile memory cell is not programmed properly.

5. The field programmable gate array of claim 1, further including a third non-volatile memory cell coupled to the read circuit, wherein the third non-volatile memory cell provides redundant storage of the information stored in the first non-volatile memory cell.

6. The field programmable gate array of claim 1, wherein each of the first and second non-volatile memory cells includes a storage transistor having a source and a drain, wherein the source and drain of the storage transistor are coupled to ground.

7. The field programmable gate array of claim 6, wherein each of the first and second non-volatile memory cells further includes an access transistor coupled to the storage transistor, the storage transistor being programmed through the access transistor.

8. The field programmable gate array of claim 6, wherein the storage transistor has a gate oxide, each of the first and second non-volatile memory cells is programmed by breaking the gate oxide of the storage transistor.

9. The field programmable gate array of claim 1, further including a first decoder coupled to the first non-volatile memory cell and a second decoder coupled to the second non-volatile memory cell, the first and second decoders to select the first non-volatile memory cell or the second non-volatile memory cell for programming.

10. The field programmable gate array of claim 1, wherein the first and second non-volatile memory cells are one-time programmable.

11. A non-volatile storage, comprising:
a first group of non-volatile storage elements;
a second group of non-volatile storage elements, wherein the first and second groups have an equal number of storage elements, each non-volatile storage element is capable of storing at least one bit of information, and wherein the second group of non-volatile storage elements are configured to store a copy of the information stored in the first group of non-volatile storage elements; and
wherein each storage element includes a one-time programmable element.

12. The non-volatile storage of claim 11, wherein each storage element includes a transistor having a source and a drain, and both the source and the drain are coupled to ground.

13. The non-volatile storage of claim 11, wherein each transistor has a gate oxide, and wherein each storage element is programmed by breaking the gate oxide of the transistor associated with the storage element.

14. The non-volatile storage of claim 11, wherein the non-volatile storage is located within a field programmable gate array (FPGA).

15. The non-volatile storage of claim 11, further including a third group of non-volatile storage elements, wherein the third group of non-volatile storage elements are configured to store a copy of the information stored in the first group of non-volatile storage elements.

16. A method for improving programming yield in a non-volatile storage device, the method comprising:
activating a programming mode;
storing data in a first location in the non-volatile storage device;
storing a redundant copy of the data in a second location in the non-volatile storage device, wherein the data stored in the first location and the data stored in the second location is coupled to a common read circuit such that the data stored in the first location and the data stored in the second location is read simultaneously during a subsequent read operation; and
deactivating the programming mode.

17. The method of claim 16, wherein the storing data in a first location comprises storing at least one bit of information in an array of one-time programmable elements.

18. The method of claim 16, further including storing another redundant copy of the data in a third location in the non-volatile storage device, wherein the data stored in the third location is coupled to the common read circuit.

19. The method of claim 16, wherein the first location includes a storage transistor having a gate oxide, and wherein storing data in a first location includes breaking the gate oxide of the storage transistor.

20. A method for retrieving data stored in a non-volatile memory of an FPGA, the method comprising:

activating a read mode in the FPGA;
retrieving data stored in a first non-volatile memory cell; and
retrieving data stored in the first non-volatile memory cell simultaneously with retrieving data stored in the first non-volatile memory cell, wherein the second non-volatile memory cell provides redundant storage of the information stored in the first non-volatile memory cell.

21. The method of claim 20, wherein activating a read mode in the FPGA includes activating a read circuit coupled to the first and second non-volatile memory cells, wherein the read circuit is configured to read both the first and second non-volatile memory cells simultaneously.

22. The method of claim 20, further including retrieving data stored in a third non-volatile memory cell simultaneously with retrieving data stored in the first and second non-volatile memory cells, wherein the third non-volatile memory cell provides redundant storage of the information stored in the first non-volatile memory cell.

23. The method of claim 20, wherein data is retrieved from the first non-volatile memory cell if the second non-volatile memory cell is defective.

24. The method of claim 20, wherein data is retrieved from the first non-volatile memory cell if the second non-volatile memory cell is not programmed properly.

25. A field programmable gate array (FPGA), comprising:
an array of one-time programmable elements to redundantly store bits of a decryption key; and
a read circuit coupled to the array of one-time programmable elements to read the decryption key from the array of one-time programmable elements for use in decrypting a bitstream.

26. The field programmable gate array of claim 25, wherein each one-time programmable element is a storage transistor having a source and a drain, wherein the source and drain of the storage transistor are coupled to ground.

27. The A field programmable gate array of claim 26, wherein the storage transistor has a gate oxide, and the storage transistor is programmed by breaking the gate oxide.

28. An apparatus comprising:
a bitstream stored in a storage device;
an encoder coupled to receive the bitstream and generate an encoded bitstream; and
a field programmable gate array coupled to receive the encoded bitstream from the encoder, the field programmable gate array storing a decryption key in redundant non-volatile memory such that each bit in the decryption key is stored multiple times.

29. The apparatus of claim 28, wherein the encoder generates the encoded bitstream using an encryption key that matches the decryption key.

30. The apparatus of claim 28, wherein the non-volatile memory comprises an array of one-time programmable elements.

31. The apparatus of claim 28, wherein the field programmable gate array further includes a read circuit coupled to the array of one-time programmable elements to read the decryption key from the array of one-time programmable elements.

* * * * *